(12) United States Patent
Lin

(10) Patent No.: US 11,244,833 B1
(45) Date of Patent: Feb. 8, 2022

(54) SELF-ALIGNED TWO-TIME FORMING METHOD CAPABLE OF PREVENTING SIDEWALLS FROM BEING DEFORMED

(71) Applicant: Shanghai Huali Microelectronics Corporation, Shanghai (CN)

(72) Inventor: Aimei Lin, Shanghai (CN)

(73) Assignee: Shanghai Huali Microelectronics Corporation, Shanghai (CN)

(*) Notice: Subject to any disclaimer, the term of this patent is extended or adjusted under 35 U.S.C. 154(b) by 0 days.

(21) Appl. No.: 17/142,500

(22) Filed: Jan. 6, 2021

(30) Foreign Application Priority Data

Nov. 11, 2020 (CN) .......................... 202011251161.X

(51) Int. Cl.
| | |
|---|---|
| *H01L 21/311* | (2006.01) |
| *C23C 16/34* | (2006.01) |
| *C23C 16/40* | (2006.01) |
| *H01L 21/033* | (2006.01) |
| *C23C 16/56* | (2006.01) |
| *C23C 16/455* | (2006.01) |
| *H01L 21/308* | (2006.01) |

(52) U.S. Cl.
CPC ...... *H01L 21/31144* (2013.01); *C23C 16/345* (2013.01); *C23C 16/401* (2013.01); *C23C 16/45529* (2013.01); *C23C 16/56* (2013.01); *H01L 21/0332* (2013.01); *H01L 21/0337* (2013.01); *H01L 21/0338* (2013.01); *H01L 21/3086* (2013.01); *H01L 21/31111* (2013.01)

(58) Field of Classification Search
None
See application file for complete search history.

(56) References Cited

U.S. PATENT DOCUMENTS

2014/0051247 A1* 2/2014 Cheng ................ H01L 21/0337
438/689

FOREIGN PATENT DOCUMENTS

CN            110718460        *   1/2020    ............ H01L 21/311

* cited by examiner

*Primary Examiner* — Jiong-Ping Lu
(74) *Attorney, Agent, or Firm* — Banner & Witcoff, Ltd.

(57) ABSTRACT

The present disclosure provides a self-aligned two-time forming method capable of preventing sidewalls from being deformed, comprises sequentially growing a first silicon nitride layer, a first silicon oxide layer, a titanium nitride layer, a second silicon oxide layer, a second silicon nitride layer and a polysilicon layer on a via layer from bottom to top; defining a pattern by using the polysilicon layer as a hard mask, and etching the second silicon nitride layer to an upper surface of the second silicon oxide layer to form a plurality of silicon nitride pattern structures from the second silicon nitride layer; forming sidewalls on sidewalls of the plurality of silicon nitride pattern structures; removing the silicon nitride pattern structures in the sidewalls; etching the silicon nitride layer and the titanium nitride layer by using the sidewalls as a hard mask to form a titanium nitride pattern structure.

10 Claims, 4 Drawing Sheets

SELF-ALIGNED TWO-TIME FORMING METHOD CAPABLE OF PREVENTING SIDEWALLS FROM BEING DEFORMED

CROSS-REFERENCE TO RELATED APPLICATIONS

This application claims priority to Chinese Patent Application No. CN 202011251161.X, filed on Nov. 11, 2020, and entitled "Self-Aligned Two-Time Forming Method Capable of Preventing Sidewalls from Being Deformed", the disclosure of which is incorporated herein by reference in its entirety.

TECHNICAL FIELD

The present application relates to the technical field of semiconductors, in particular to a self-aligned two-time forming method capable of preventing sidewalls from being deformed.

BACKGROUND

After the design dimension of integrated circuits is less than 40 nm, a self-aligned two-time forming process is invented and used. The existing process integration has an obvious defect of metal wire deformation, for the reasons that the stress of the film combination used in one-step formation at 530° C. does not match, the angle of the sidewalls after the sidewall etching process is about 87°, the NDC (Silicon carbide nitride, SiCN) at the bottom of the sidewalls has been obviously deformed, the stress is released after the core layer $SiO_2$ in the sidewalls is removed by adopting a wet process, the sidewalls are inclined obviously, and the angle is about 82°. In this case, the accurate dimension of titanium nitride below the sidewalls cannot be defined in the subsequent process, thus influencing the shape of the final metal wire.

BRIEF SUMMARY

According to one embodiment of the current disclosure, a self-aligned two-time forming method capable of preventing sidewalls from being deformed, which at least includes:

step 1: growing composite film layers on a via layer, the composite film layers sequentially including a first silicon nitride layer, a first silicon oxide layer, a titanium nitride layer, a second silicon oxide layer, a second silicon nitride layer and a polysilicon layer from bottom to top;

step 2: defining a pattern by using the polysilicon layer as a hard mask and etching the second silicon nitride layer to an upper surface of the second silicon oxide layer according to the defined pattern to form a plurality of silicon nitride pattern structures from the second silicon nitride layer;

step 3: respectively forming sidewalls on sidewalls of the plurality of silicon nitride pattern structures;

step 4: removing the silicon nitride pattern structures in the sidewalls;

step 5: etching the second silicon oxide layer and the titanium nitride layer by using the sidewalls as a hard mask to form a titanium nitride pattern structure;

step 6: etching the first silicon oxide layer and the first silicon nitride layer by using the titanium nitride pattern structure as a hard mask to pattern the first silicon oxide layer and the first silicon nitride layer.

In some examples, in step 1, via layer includes a plurality of vias and a dielectric layer is filled between the vias.

In some examples, in step 1, the first silicon oxide layer and the second silicon oxide layer are formed by adopting a chemical vapor deposition method.

In some examples, in step 1, the temperature of forming the first silicon oxide layer and the second silicon oxide layer by adopting the chemical vapor deposition method is 400° C.

In some examples, in step 1, the first silicon nitride layer and the second silicon nitride layer are formed by adopting a chemical vapor deposition method.

In some examples, in step 1, the temperature of forming the first silicon nitride layer and the second silicon nitride layer by adopting the chemical vapor deposition method is 400° C.

In some examples, in step 1, the polysilicon layer is formed by adopting a diffusion furnace process.

In some examples, in step 3, the sidewalls formed on the sidewalls of the silicon nitride pattern structures are polysilicon sidewalls.

In some examples, in step 3, a method for forming the polysilicon sidewalls adopts a diffusion furnace process and the growth temperature is 530° C.

In some examples, in step 4, the silicon nitride pattern structures in the sidewalls are removed by adopting a wet etching method.

DETAILED DESCRIPTION

The embodiments of the present disclosure will be described below through specific examples, and those skilled in the art can easily understand other advantages and effects of the present application from the content disclosed in the description. The present application may also be implemented or applied through other different specific embodiments, and various details in the description may also be modified or changed based on different viewpoints and applications without departing from the spirit of the present disclosure.

Please refer to FIG. 1 to FIG. 7. It should be noted that the drawings provided in the embodiments are only used for schematically describing the basic concept of the present application, thus only illustrate components related to the present application, and are not drawn according to the number, shape and size of the components in the actual implementation. The form, number and scale of the components may be freely changed and the layout of the components may be more complex.

Figure 1:
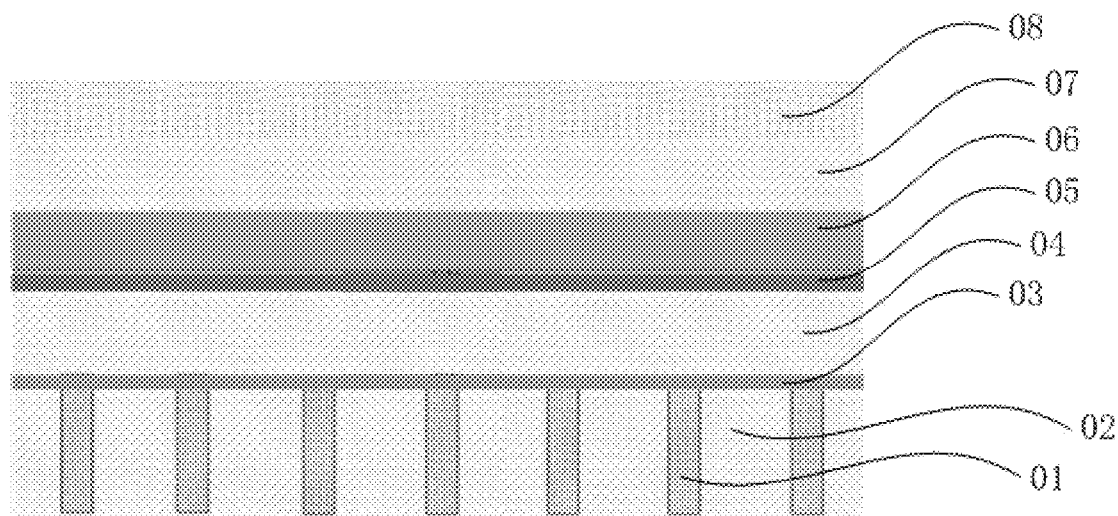
FIG. 1 illustrates a structural schematic view of composite film layers on vias in the present disclosure.
Figure 7:
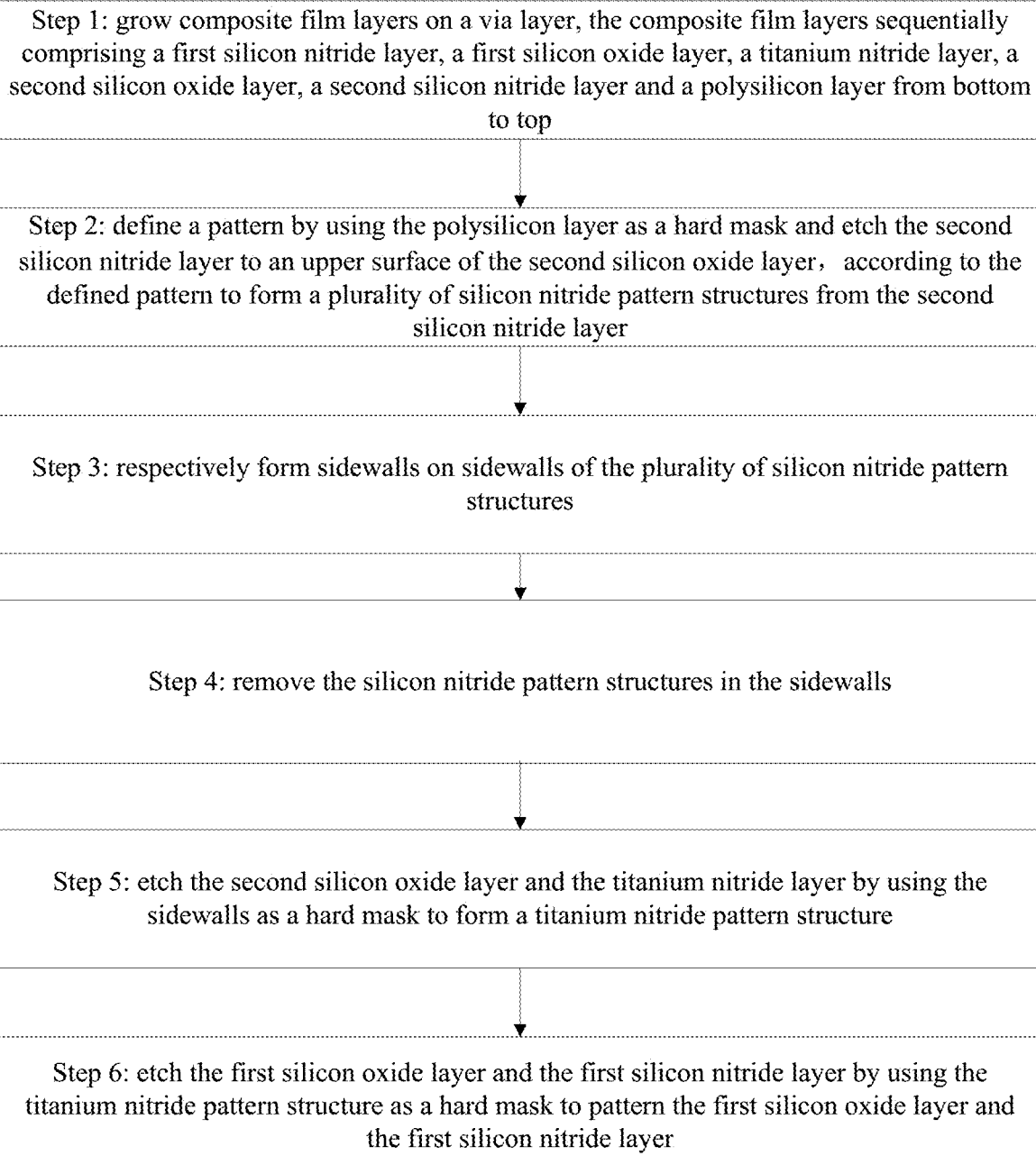
FIG. 7 illustrates a flowchart of a self-aligned two-time forming method capable of preventing sidewalls from being deformed provided by the present disclosure.

The present application provides a self-aligned two-time forming method capable of preventing sidewalls from being deformed. Referring to FIG. 7, it illustrates a flowchart of the self-aligned two-time forming method capable of preventing sidewalls from being deformed provided by the present application. The self-aligned two-time forming method capable of preventing sidewalls from being deformed at least includes the following steps:

In step 1, composite film layers are formed on a via layer. The composite film layers sequentially include a first silicon nitride layer, a first silicon oxide layer, a titanium nitride layer, a second silicon oxide layer, a second silicon nitride layer and a polysilicon layer from bottom to top. Referring to FIG. 1, it illustrates a structural schematic view of composite film layers on vias in the present application. The composite film layers grown on the via layer sequentially include a first silicon nitride layer 03, a first silicon oxide layer 04, a titanium nitride layer 05, a second silicon oxide layer 06, a second silicon nitride layer 07 and a polysilicon layer 08 from bottom to top.

Further, in the present application, in step 1 of the present embodiment, the via layer includes a plurality of vias, and a dielectric layer is filled between the vias. In the present embodiment, the via layer is located on a substrate, and the via layer includes a plurality of vias 02 and a dielectric layer 02 located between the vias 01.

Further, in the present application, in step 1 of the present embodiment, the first silicon oxide layer and the second silicon oxide layer are formed by adopting a chemical vapor deposition method. Further, in the present application, in step 1 of the present embodiment, the temperature of forming the first silicon oxide layer and the second silicon oxide layer by adopting the chemical vapor deposition method is 400° C.

Further, in the present application, in step 1 of the present embodiment, the first silicon nitride layer and the second silicon nitride layer are formed by adopting a chemical vapor deposition method. Further, in the present application, in step 1 of the present embodiment, the temperature of forming the first silicon nitride layer and the second silicon nitride layer by adopting the chemical vapor deposition method is 400° C.

Further, in the present application, in step 1 of the present embodiment, the polysilicon layer 08 is formed by adopting a diffusion furnace process.

Figure 2:
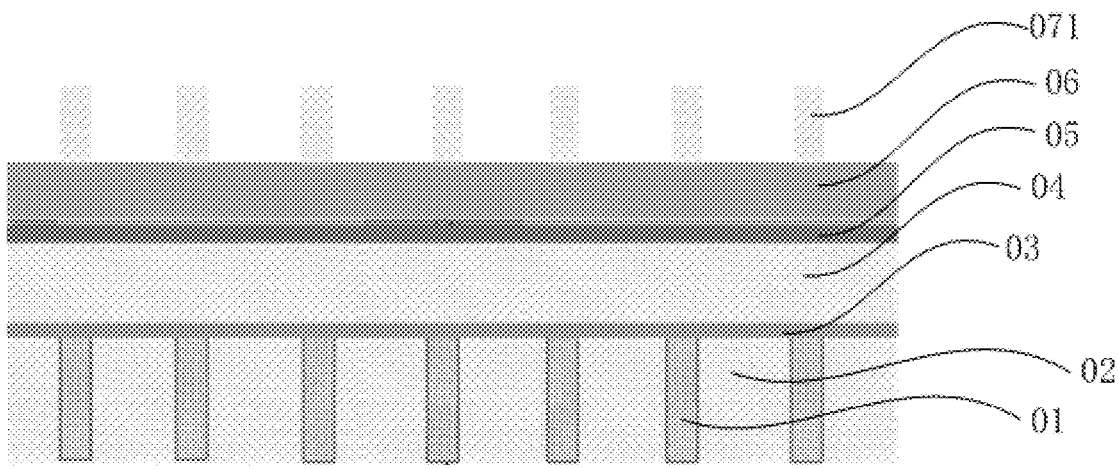
FIG. 2 illustrates a structural schematic view when a plurality of silicon nitride pattern structures are formed from a silicon nitride layer in the present disclosure.

In step 2, a pattern is defined by using the polysilicon layer as a hard mask and the second silicon nitride layer is etched to an upper surface of the second silicon oxide layer according to the defined pattern to form a plurality of silicon nitride pattern structures from the second silicon nitride layer. Referring to FIG. 2, it illustrates a structural schematic view when a plurality of silicon nitride pattern structures are formed from the silicon nitride layer in the present application. In step 2, a pattern is defined by using the polysilicon layer 08 as a hard mask and the second silicon nitride layer 07 is etched to an upper surface of the second silicon oxide layer 06 according to the defined pattern to form a plurality of silicon nitride pattern structures 071 from the second silicon nitride layer.

Figure 3:
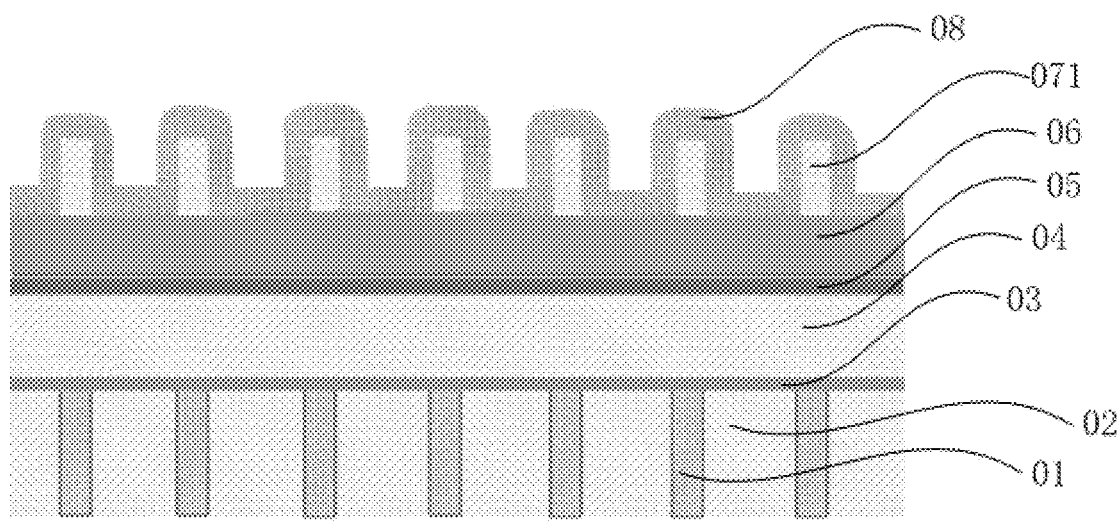
FIG. 3 illustrates a structural schematic view after a polysilicon layer is deposited on a plurality of silicon nitride pattern structures in the present disclosure.
Figure 4:
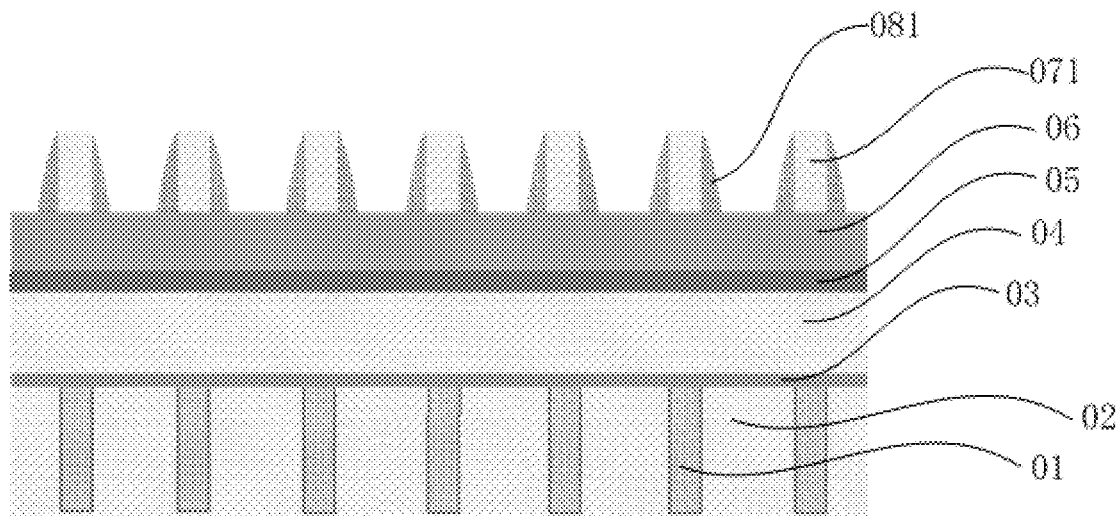
FIG. 4 illustrates a structural schematic view after sidewalls are respectively formed on sidewalls of a plurality of silicon nitride pattern structures in the present disclosure.

In step 3, sidewalls are respectively formed on sidewalls of the plurality of silicon nitride pattern structures. Referring to FIG. 3, it illustrates a structural schematic view after a polysilicon layer is deposited on a plurality of silicon nitride pattern structures in the present application. Referring to FIG. 4, it illustrates a structural schematic view after sidewalls are respectively formed on sidewalls of a plurality of silicon nitride pattern structures in the present application. Before the sidewalls are formed in step 3, firstly a polysilicon layer 08 is deposited on the plurality of silicon nitride pattern structures, and then the polysilicon layer 08 is etched to form the sidewalls 081.

Further, in the present application, in step 3 of the present embodiment, the sidewalls formed on the sidewalls of the silicon nitride pattern structures are polysilicon sidewalls.

Further, in the present application, in step 3 of the present embodiment, a method for forming the polysilicon sidewalls adopts a diffusion furnace process and the growth temperature is 530° C.

Figure 5:
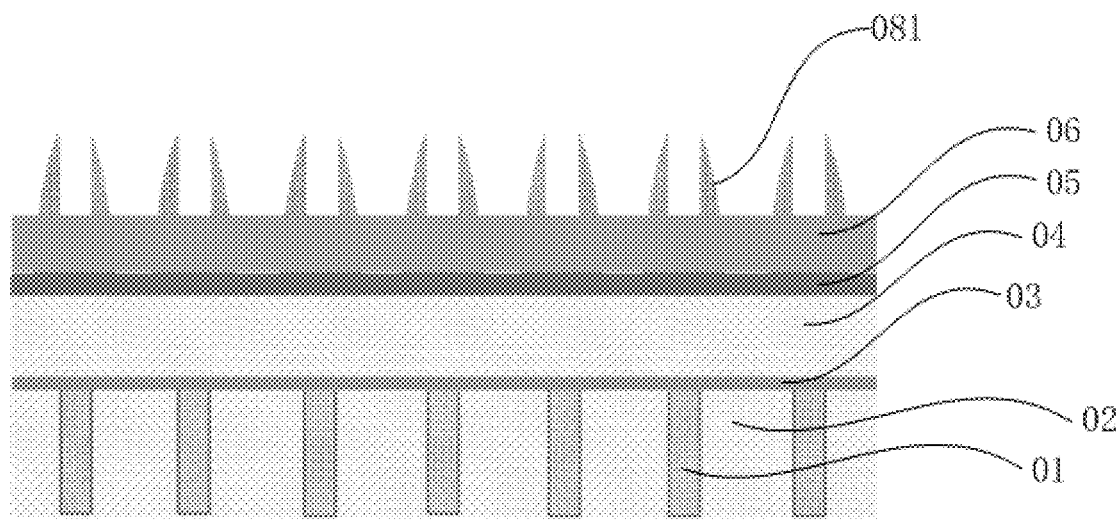
FIG. 5 illustrates a structural schematic view after silicon nitride pattern structures in sidewalls are removed in the present disclosure.

In step 4, the silicon nitride pattern structures in the sidewalls are removed. Referring to FIG. 5, it illustrates a structural schematic view after the silicon nitride pattern structures in the sidewalls are removed in the present application.

Further, in the present application, in step 4 of the present embodiment, the silicon nitride pattern structures in the sidewalls are removed by adopting a wet etching method.

In step 5, the second silicon oxide layer and the titanium nitride layer are etched by using the sidewalls as a hard mask to form a titanium nitride pattern structure. In step 5, the second silicon oxide layer 06 and the titanium nitride layer 05 are etched downwards along the sidewalls 081 in FIG. 5, such that a titanium nitride pattern structure is formed from the titanium nitride layer 05.

Figure 6:
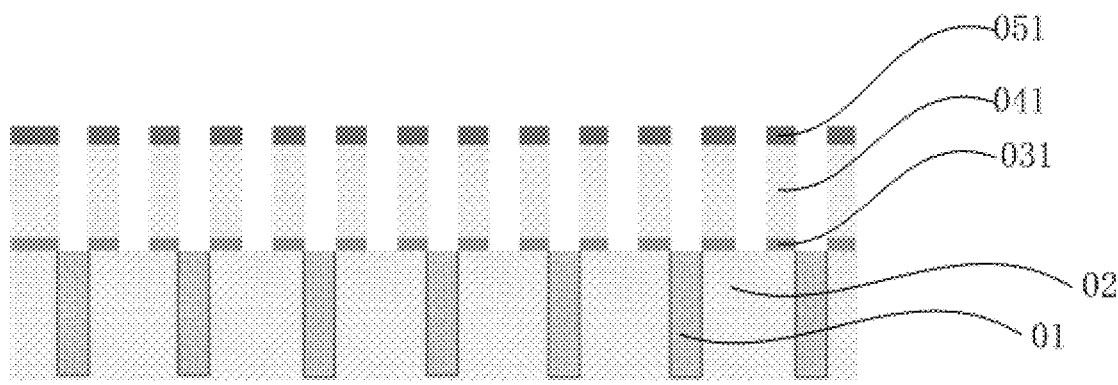
FIG. 6 illustrates a structural schematic view after a first silicon oxide layer and a first silicon nitride layer are patterned in the present disclosure.

In step 6, the first silicon oxide layer and the first silicon nitride layer are etched by using the titanium nitride pattern structure as a hard mask to pattern the first silicon oxide layer and the first silicon nitride layer. Referring to FIG. 6, it illustrates a structural schematic view after the first silicon oxide layer and the first silicon nitride layer are patterned in the present application. In step 6, the first silicon oxide layer and the first silicon nitride layer are further etched downwards along the titanium nitride pattern structure till an upper surface of the dielectric layer 02 is exposed. A first silicon oxide pattern structure 041 and A first silicon nitride pattern structure 031 are formed; after etching is performed along the titanium nitride pattern structure, the titanium nitride pattern structure has not been fully consumed in the present embodiment, so there is still a part of the titanium nitride pattern structure (i.e., the remaining titanium nitride pattern structure 051) on the first silicon oxide pattern structure 041.

To sum up, by integrating the film layers again, the stress between the film layers under high temperature can match, the problem that the sidewalls are inclined is thoroughly solved, and the pattern definition of two-time formation is smoothly realized. Therefore, the present application effectively overcomes various disadvantages in the prior art and thus has a great industrial utilization value.

The above embodiments are used for exemplarily describing the principle and effect of the present disclosure only, instead of limiting the present disclosure. Those skilled in the art may modify or change the above embodiments without going beyond the spirit and scope of the present disclosure. Therefore, all equivalent modifications or changes made by those skilled in the art without departing from the spirit and technical concept disclosed in the present application shall still be covered by the claims of the present disclosure.

What is claimed is:

1. A self-aligned two-time forming method capable of preventing sidewalls from being deformed, wherein the self-aligned two-time forming method capable of preventing sidewalls from being deformed at least comprises:
- step 1: growing composite film layers on a via layer, the composite film layers sequentially comprising a first silicon nitride layer, a first silicon oxide layer, a titanium nitride layer, a second silicon oxide layer, a second silicon nitride layer and a polysilicon layer from bottom to top;
- step 2: defining a pattern by using the polysilicon layer as a hard mask and etching the second silicon nitride layer to an upper surface of the second silicon oxide layer according to the defined pattern to form a plurality of silicon nitride pattern structures from the second silicon nitride layer;
- step 3: respectively forming sidewalls on sidewalls of the plurality of silicon nitride pattern structures;
- step 4: removing the silicon nitride pattern structures in the sidewalls;
- step 5: etching the second silicon oxide layer and the titanium nitride layer by using the sidewalls as a hard mask to form a titanium nitride pattern structure; and
- step 6: etching the first silicon oxide layer and the first silicon nitride layer by using the titanium nitride pattern structure as a hard mask to pattern the first silicon oxide layer and the first silicon nitride layer.

2. The self-aligned two-time forming method capable of preventing sidewalls from being deformed according to claim 1, wherein in step 1, the via layer comprises a plurality of vias and a dielectric layer is filled between the vias.

3. The self-aligned two-time forming method capable of preventing sidewalls from being deformed according to claim 1, wherein in step 1, the first silicon oxide layer and the second silicon oxide layer are formed by adopting a chemical vapor deposition method.

4. The self-aligned two-time forming method capable of preventing sidewalls from being deformed according to claim 3, wherein in step 1, the temperature of forming the first silicon oxide layer and the second silicon oxide layer by adopting the chemical vapor deposition method is 400° C.

5. The self-aligned two-time forming method capable of preventing sidewalls from being deformed according to claim 1, wherein in step 1, the first silicon nitride layer and the second silicon nitride layer are formed by adopting a chemical vapor deposition method.

6. The self-aligned two-time forming method capable of preventing sidewalls from being deformed according to claim 5, wherein in step 1, the temperature of forming the first silicon nitride layer and the second silicon nitride layer by adopting the chemical vapor deposition method is 400° C.

7. The self-aligned two-time forming method capable of preventing sidewalls from being deformed according to claim 5, wherein in step 1, the polysilicon layer is formed by adopting a diffusion furnace process.

8. The self-aligned two-time forming method capable of preventing sidewalls from being deformed according to claim 1, wherein in step 3, the sidewalls formed on the sidewalls of the silicon nitride pattern structures are poly silicon sidewalls.

9. The self-aligned two-time forming method capable of preventing sidewalls from being deformed according to claim 1, wherein in step 3, a method for forming the polysilicon sidewalls adopts a diffusion furnace process and the growth temperature is 530° C.

10. The self-aligned two-time forming method capable of preventing sidewalls from being deformed according to claim 1, wherein in step 4, the silicon nitride pattern structures in the sidewalls are removed by adopting a wet etching method.

* * * * *